(12) United States Patent
Ramirez

(10) Patent No.: US 10,802,176 B2
(45) Date of Patent: Oct. 13, 2020

(54) METHODS AND DEVICES FOR MAGNETIC RESONANCE MEASUREMENTS USING DECOUPLED TRANSMIT ANTENNAS

(71) Applicant: Marc Stephen Ramirez, Missouri City, TX (US)

(72) Inventor: Marc Stephen Ramirez, Missouri City, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 688 days.

(21) Appl. No.: 15/431,938

(22) Filed: Feb. 14, 2017

(65) Prior Publication Data

US 2018/0231682 A1 Aug. 16, 2018

(51) Int. Cl.
*G01V 3/32* (2006.01)
*E21B 47/00* (2012.01)

(52) U.S. Cl.
CPC ..................... *G01V 3/32* (2013.01)

(58) Field of Classification Search
CPC .. G01V 3/32; G01R 33/3808; G01R 33/3607; G01R 33/3621; G01R 33/448; G01R 33/445; G01N 24/08; G01N 24/081
See application file for complete search history.

(56) References Cited

U.S. PATENT DOCUMENTS

| | | | |
|---|---|---|---|
| 5,280,246 A | 1/1994 | Takahashi et al. | |
| 5,646,531 A | 7/1997 | Renz | |
| 6,201,392 B1 | 3/2001 | Anderson et al. | |
| 6,720,765 B2 | 4/2004 | Edwards et al. | |
| 6,751,496 B2 | 6/2004 | Su et al. | |
| 6,781,371 B2 | 8/2004 | Taherian et al. | |
| 8,035,382 B2 | 10/2011 | Devries et al. | |

(Continued)

FOREIGN PATENT DOCUMENTS

WO 2004099817 A2 11/2004
WO 2015072985 A1 5/2015

OTHER PUBLICATIONS

Hardy et al.; "Transmit Array Design"; May 2006;Retrieved on Dec. 5, 2016; Retrieved from the Internet; URL: https://afni.nimh.nih.gov/sscc/staff/rwcox/ISMRM_2006/ISMRM%20M-F%202006/filesiThA_08.pdf; 9 pages.

(Continued)

*Primary Examiner* — Rishi R Patel
(74) *Attorney, Agent, or Firm* — Cantor Colburn LLP

(57) ABSTRACT

A nuclear magnetic resonance apparatus includes a magnet assembly, a transmitting antenna configured to generate an oscillating magnetic field in a sensitive volume within an earth formation, and one or more receiving antennas configured to detect a nuclear magnetic resonance signal originating in the sensitive volume. The one or more receiving antennas are arranged relative so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction predominantly opposed to the first direction.

20 Claims, 8 Drawing Sheets

(56) References Cited

U.S. PATENT DOCUMENTS

| | | |
|---|---|---|
| 9,395,427 B2 | 7/2016 | Biber et al. |
| 2004/0046552 A1 | 3/2004 | Taherian et al. |
| 2012/0068709 A1 | 3/2012 | Crozier et al. |
| 2013/0063142 A1 | 3/2013 | Hopper et al. |
| 2013/0093422 A1 | 4/2013 | Morys et al. |
| 2014/0357935 A1 | 12/2014 | Ilmoniemi et al. |
| 2015/0002156 A1 | 1/2015 | Leussler et al. |
| 2015/0015259 A1 | 1/2015 | Duan et al. |
| 2015/0048828 A1 | 2/2015 | Ha et al. |
| 2016/0299249 A1 | 10/2016 | Ramirez et al. |
| 2017/0082772 A1* | 3/2017 | Xiao ............... G01V 3/32 |
| 2017/0082773 A1* | 3/2017 | Xiao ............... G01V 3/32 |
| 2017/0082774 A1* | 3/2017 | Xiao ............... G01V 3/32 |
| 2017/0082775 A1* | 3/2017 | Xiao ............... G01V 3/32 |
| 2017/0085008 A1* | 3/2017 | Xiao ............. G01R 33/3415 |
| 2017/0176627 A1* | 6/2017 | Venkataramanan ..... G01V 3/32 |
| 2017/0343697 A1* | 11/2017 | Ramirez ........ G01R 33/34046 |
| 2018/0149765 A1* | 5/2018 | Hurlimann ........... G01N 24/081 |

OTHER PUBLICATIONS

Hiroyuki, et al. "Array Coil Types and Design Principles"; May 2006; Retrieved on Dec. 5, 2016; Retrieved from the Internet; URL: https://afni.nimh.nih.gov/sscc/staff/rwcox/ISMRM_2006/ISMRM%20M-F%202006/files/ThA_08.pdf; 9 pages.

International Search Report for International Application No. PCT/2018/018143, International Filing Date Feb. 14, 2018, dated Jul. 3, 2018, 3 pages.

Roemer, et al.; "The NMR Phased Array"; 1990; Magnetic Resonance in Medicine 16; Academic Press, Inc.; 34 pages.

Written Opinion for Internation Application No. PCT/2018/018143, International Filing Date Feb. 14, 2018, dated Jul. 3, 2018, 11 pages.

\* cited by examiner

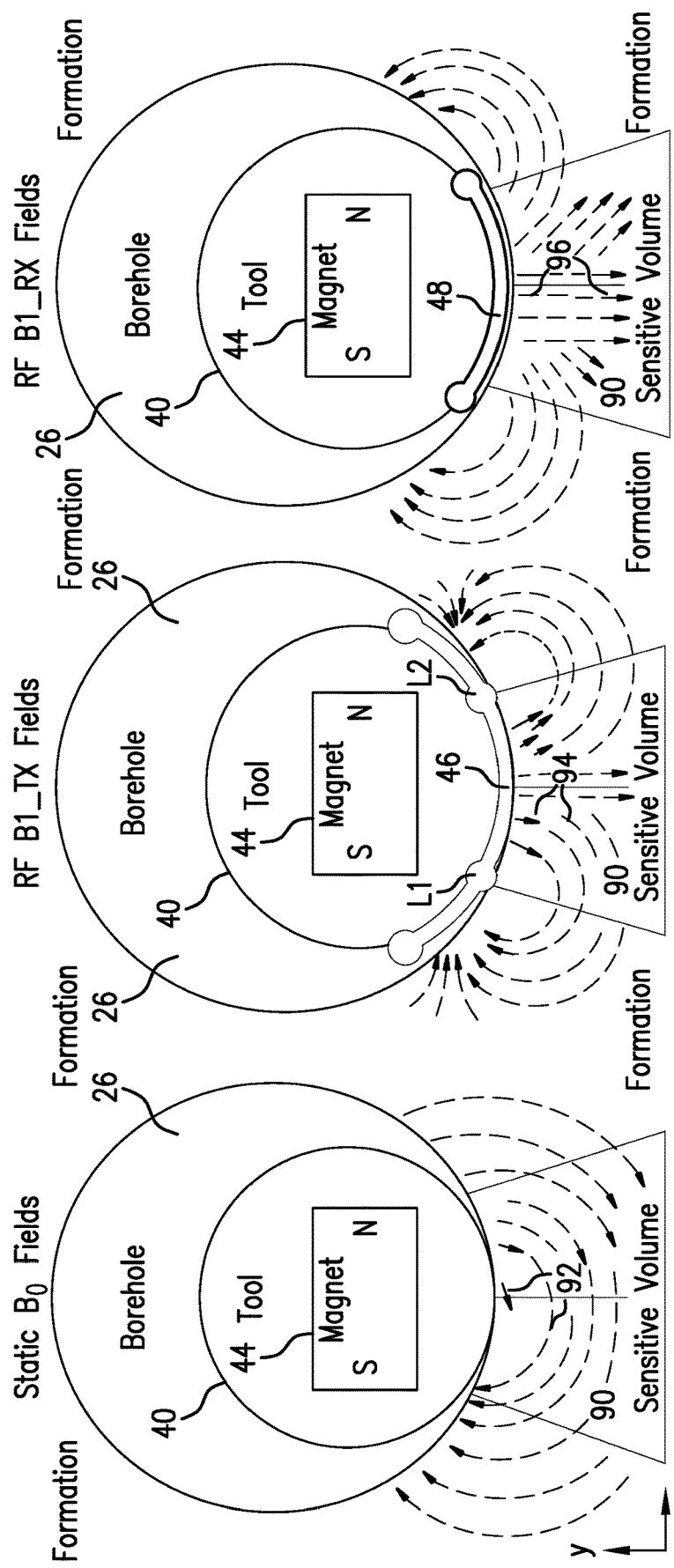

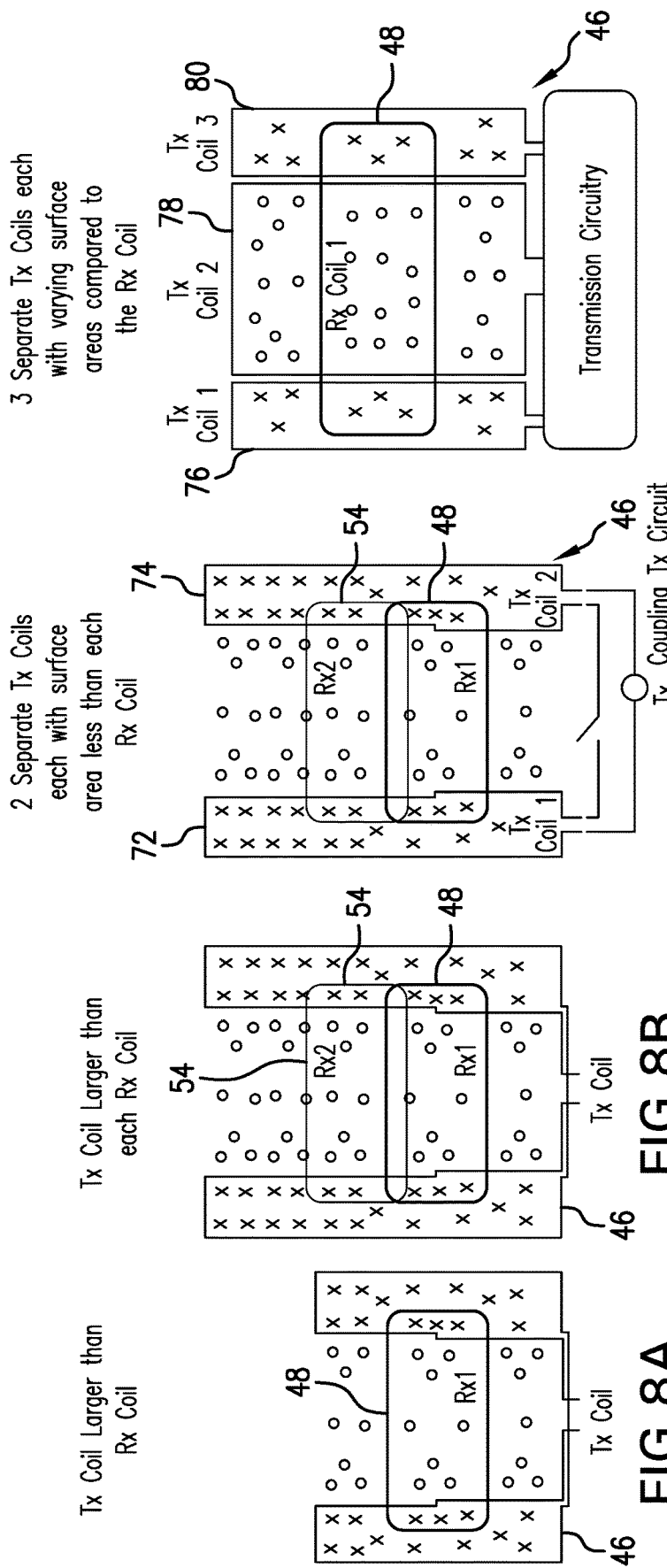

ing antennas having an orientation that is at least substantially orthogonal to the static magnetic field in the sensitive volume. The one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction.

METHODS AND DEVICES FOR MAGNETIC RESONANCE MEASUREMENTS USING DECOUPLED TRANSMIT ANTENNAS

BACKGROUND

Understanding the characteristics of geologic formations and fluids located therein is important for effective hydrocarbon exploration and production. Formation evaluation relies on accurate petrophysical interpretation derived from a diverse set of logging technologies. One such technology, nuclear magnetic resonance (NMR), can be used to estimate formation characteristics such as mineralogy-independent porosity and permeability of rocks, to perform fluid typing and determine fluid volumes, and to estimate fluid characteristics such as viscosity.

SUMMARY

An embodiment of a nuclear magnetic resonance apparatus for estimating properties of an earth formation includes a carrier configured to be deployed in a borehole in the earth formation, a magnet assembly disposed in the carrier and configured to generate a static magnetic field in the formation, a transmitting antenna disposed in the carrier and configured to generate an oscillating magnetic field in a sensitive volume within the earth formation, the oscillating magnetic field being at least substantially orthogonal to the static magnetic field in the sensitive volume, and one or more receiving antennas disposed in the carrier and configured to detect a nuclear magnetic resonance (NMR) signal originating in the sensitive volume, the one or more receiving antennas having an orientation that is at least substantially orthogonal to the static magnetic field in the sensitive volume. The one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction.

Another embodiment of a nuclear magnetic resonance apparatus for estimating properties of an earth formation includes a carrier configured to be deployed in a borehole in the earth formation, a magnet assembly disposed in the carrier and configured to generate a static magnetic field in the formation, a transmitting antenna disposed in the carrier and configured to generate an oscillating magnetic field in a sensitive volume within the earth formation, the oscillating magnetic field being at least substantially orthogonal to the static magnetic field in the sensitive volume, and one or more receiving antennas disposed in the carrier and configured to detect a nuclear magnetic resonance (NMR) signal originating in the sensitive volume, the one or more receiving antennas having an orientation that is at least substantially orthogonal to the static magnetic field in the sensitive volume. The transmitting antenna is arranged relative to the one or more receiving antennas so that the transmitting antenna is inductively decoupled from the one or more receiving antennas, a first region of the transmitting antenna overlapping a first portion of the surface area of the one or more receiving antennas in which a magnetic flux of the transmitting antenna is in a first direction, and a second region of the transmitting antenna overlapping a second portion of the surface area of the one or more receiver antennas overlapping a in which the magnetic flux is in a second direction, the second direction being predominantly opposed to the first direction.

An embodiment of a method of estimating properties of an earth formation includes deploying a carrier into a borehole in the earth formation, generating a static magnetic field by a magnet assembly disposed in the carrier, and generating an oscillating magnetic field in a sensitive volume within the earth formation by a transmitting antenna disposed in the carrier, the oscillating magnetic field being at least substantially orthogonal to the static magnetic field in the sensitive volume. The method also includes detecting a nuclear magnetic resonance (NMR) signal by one or more receiving antennas, the one or more receiving antennas having an orientation that is at least substantially orthogonal to the static magnetic field in the sensitive volume, and estimating the properties of the earth formation based on the detected signal. The one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIGS. 4A-4C are top-down views of the measurement apparatus of FIGS. 3A and 3B, showing spatial relationships among static magnetic fields and magnetic fields from transmitting and receiving antennas in sensitive volume of a formation.

FIGS. 8A-8D depict examples of antenna assemblies configured to result in one or more receiving antennas that are inductively decoupled from a transmitting antenna assembly.

DETAILED DESCRIPTION

Apparatuses and methods for measuring characteristics of an earth formation using magnetic resonance techniques are described herein. An embodiment of a nuclear magnetic resonance (NMR) apparatus or tool includes a magnet assembly configured to generate static magnetic fields, and an antenna assembly including one or more transmitting antennas and one or more receiving antennas. Both the transmitting antenna(s) and the receiving antenna(s) are oriented so that their respective magnetic fields are at least substantially orthogonal to a static magnetic field generated by the magnet assembly in a sensitive volume in a formation.

The antennas are geometrically configured to inductively decouple the receiving antenna(s) from a transmitting antenna during emission of an oscillating magnetic field and during reception of NMR measurement signals. In one embodiment, each receiving and transmitting antenna defines a surface area having a shape, size and location so that the transmitting antenna or antennas are inductively decoupled from the receiving antenna or antennas. As described herein, a "decoupled" configuration refers to a configuration in which inductive coupling between the transmitting and the receiving antennas is eliminated, or at least reduced or minimized. In one embodiment, the transmitter and receiver antennas are configured relative to each other so that the surface area of the receiver antenna intersects regions of opposing magnetic flux. For example, the receiver antenna is configured so that the surface area overlaps the transmitting antenna and intersects a first region of the transmitting antenna through which the magnetic flux is exclusively or primarily positive, and a second region of the transmitting antenna through which the magnetic flux is exclusively or primarily negative. The embodiments described herein result in a substantial or complete cancellation of the magnetic flux of the transmit antenna(s) within the receiving antenna(s), thereby inductively decoupling the receiving antenna(s) from the transmitting antenna(s). Despite the geometric determination of antennas to achieve inductive decoupling, the antenna designs discussed here maintain magnetic fields with primarily the same orientation in the sensitive formation volume.

Figure 1:
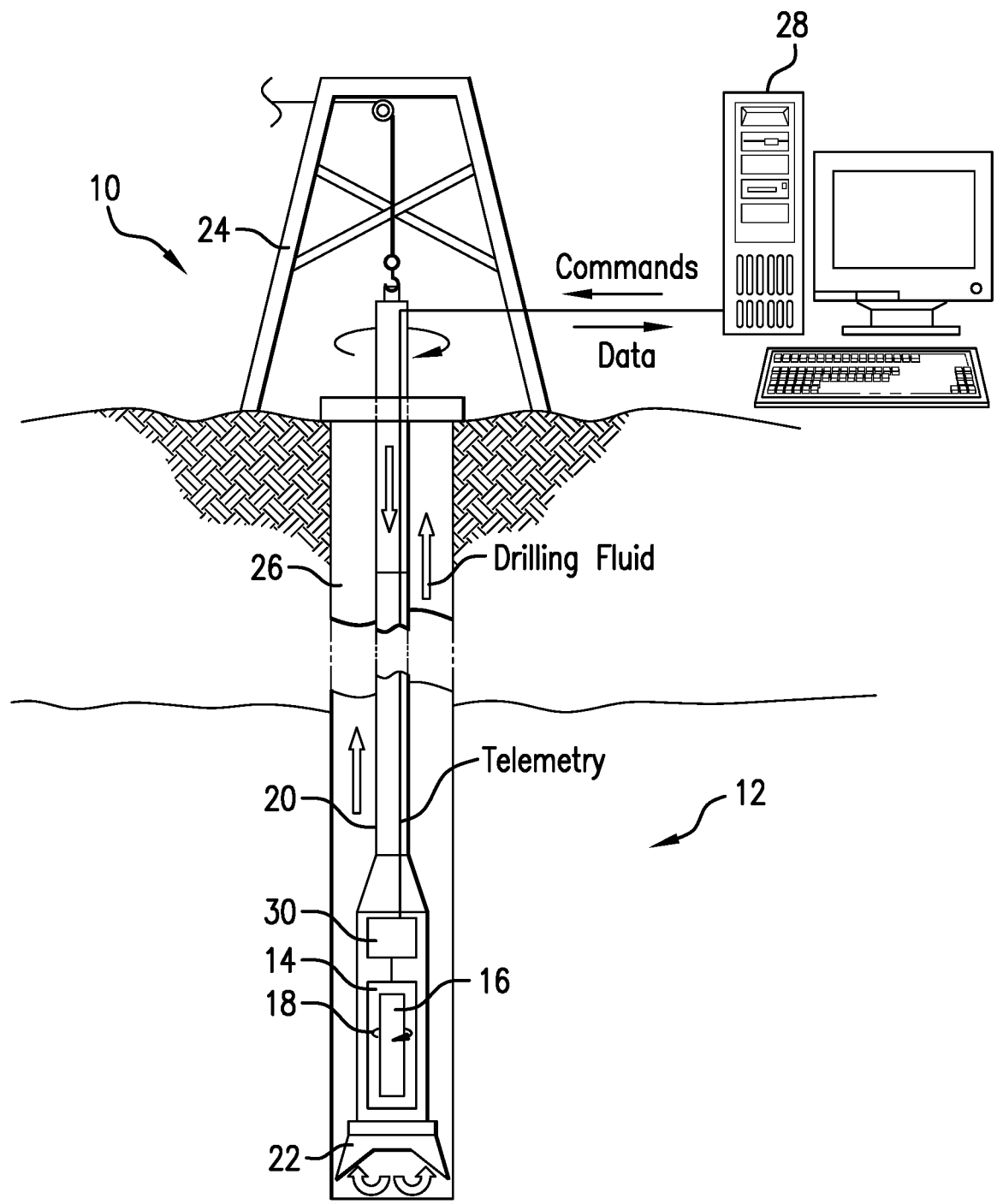
FIG. 1 depicts an embodiment of a formation measurement system that includes a nuclear magnetic resonance (NMR) measurement apparatus for logging while drilling.
Figure 2:
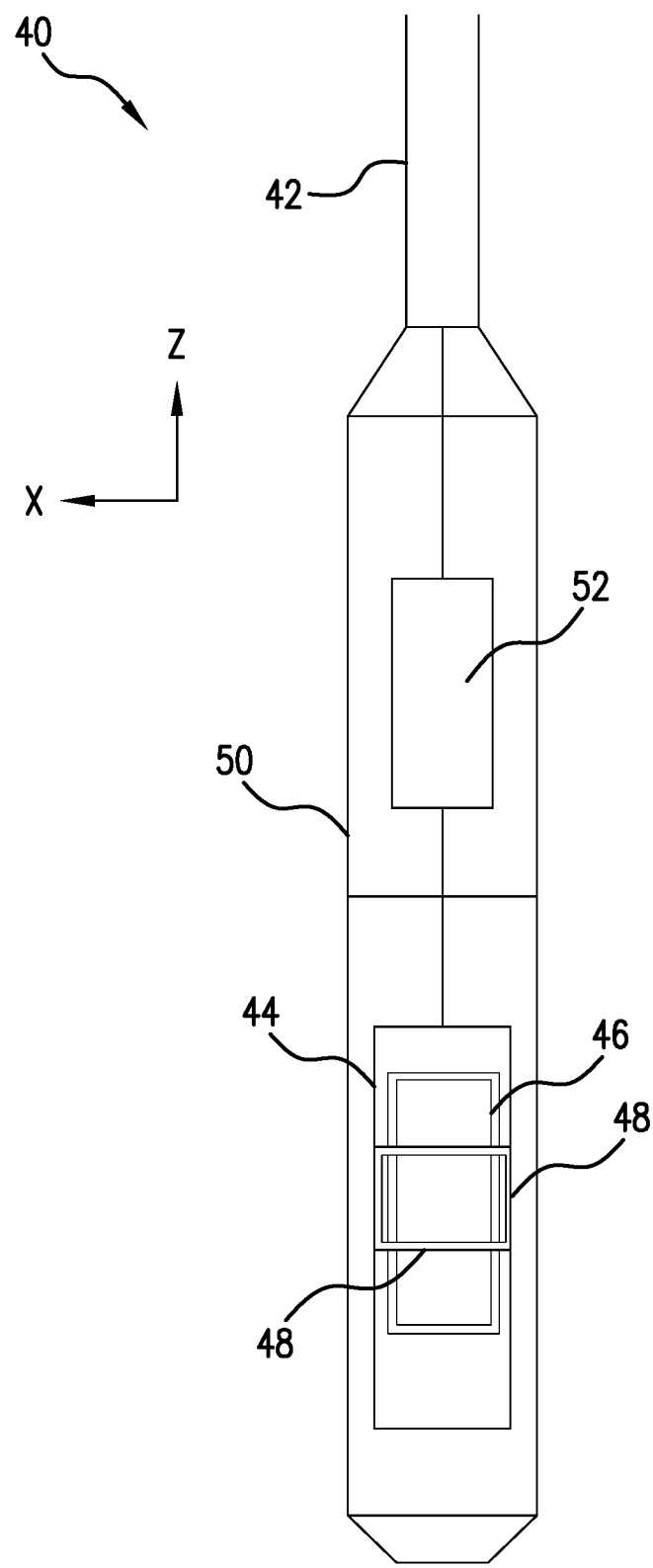
FIG. 2 depicts an embodiment of a downhole tool for performing NMR measurements after drilling.

FIG. 1 illustrates an exemplary embodiment of a downhole measurement, data acquisition, and/or analysis system 10 that includes devices or systems for in-situ measurement of characteristics of an earth formation 12. The system 10 includes a magnetic resonance apparatus such as a NMR tool 14. An example of the magnetic resonance apparatus is a logging-while-drilling (LWD) magnetic resonance tool. The tool 14 is configured to generate magnetic resonance data for use in estimating characteristics of a formation, such as porosity, irreducible water saturation, permeability, hydrocarbon content, and fluid viscosity.

An exemplary tool 14 includes a static magnetic field source 16 that magnetizes formation materials and a transmitter assembly 18 (e.g., an antenna or antenna assembly) that transmits RF energy or pulsed energy that provides an oscillating magnetic field in the formation. The transmitter assembly 18 may also serve the receive function, or distinct receiving antennas may be used for reception. It can be appreciated that the tool 14 may include a variety of components and configurations as known in the art of nuclear magnetic resonance or magnetic resonance imaging.

The tool 14 may be configured as a component of various subterranean systems, such as wireline well logging and LWD systems. For example, the tool 14 can be incorporated within a drill string 20 including a drill bit 22 or other suitable carrier and deployed downhole, e.g., from a drilling rig 24 into a borehole 26 during a drilling operation. The tool 14 is not limited to the embodiments described herein, and may be deployed in a carrier with alternative conveyance methods. A "carrier" as described herein means any device, device component, combination of devices, media and/or member that may be used to convey, house, support or otherwise facilitate the use of another device, device component, combination of devices, media, and/or member. Exemplary non-limiting carriers include drill strings of the coiled tube type, of the jointed pipe type, and any combination or portion thereof. Other carrier examples include casing pipes, wirelines, wireline sondes, slickline sondes, drop shots, downhole subs, bottom-hole assemblies, and drill strings.

In one embodiment, the tool 14 and/or other downhole components are equipped with transmission equipment to communicate ultimately to a surface processing unit 28. Such transmission equipment may take any desired form, and different transmission media and methods may be used, such as wired, fiber optic, and/or wireless transmission methods. Additional processing units may be deployed with the carrier. For example, a downhole electronics unit 30 includes various electronic components to facilitate receiving signals and collect data, transmitting data and commands, and/or processing data downhole. The surface processing unit 28, electronics 30, the tool 14, and/or other components of the system 10 include devices as necessary to provide for storing and/or processing data collected from the tool 14 and other components of the system 10. Exemplary devices include, without limitation, at least one processor, storage, memory, input devices, output devices, and the like.

In one embodiment, magnetic resonance measurements are performed by a nuclear magnetic resonance tool, which generates a static magnetic field ($B_0$) in a volume within the formation using one or more magnets (e.g., the magnetic field source 16). An oscillating (e.g., RF) magnetic field ($B_1$), which is at least substantially orthogonal to the static magnetic field, is generated in the sensitive formation volume with an RF antenna.

A receiving assembly detects the excited NMR signal and captures its relaxation back to thermal equilibrium. The signal originates from the net magnetization resulting from the superposition of signal from individual hydrogen protons in the formation fluid. These signals are formed using a series of spin echoes (i.e. resulting in an echo train), which are detected by the tool, numerically processed, and ultimately displayed in NMR logs. The amplitude of these spin echoes is detected as a function of time, allowing for detection of both the initial amplitude (i.e. for porosity measurement) and the signal decay, which can be used to derive other formation and fluid characteristics after the data inversion procedure.

FIGS. 2, 3A, 3B and 4A-C illustrate an example of a measurement apparatus configured as a NMR tool 40 for logging a formation. The tool 40 may be a wireline tool in which the tool 40 is connected to the surface via a wireline 42, a LWD tool or any other suitable type of tool. The static magnetic field source includes one or more magnet assemblies 44. The magnet assemblies 44 described in embodiments herein are permanent magnets, but are not so limited.

In one embodiment, the magnet assemblies include electromagnets, a combination of permanent magnets and electromagnets, or magnets in combination with soft magnetic materials. The tool 40 includes a transmitting antenna 46 configured as one or more transmitting coils, and a receiving antenna 48 in the form of one or more receiving coils. The transmitting and/or receiving antenna may have a single or multiple loops, windings, or turns. For example, an antenna used for transmitting and/or receiving can be a conventional loop in a round or rectangular pattern, a multi-turn coil, a twisted butterfly-like coil, or an inverted saddle coil.

Other components of the tool include, for example, a sonde 50 or other carrier, and an electronics unit 52 connected to the antennas 46 and 48, and/or to the magnet assembly 44. The electronics unit 52 and/or coils are connected to a surface location via the wireline 42 or other suitable telemetry system.

Figure 3A:
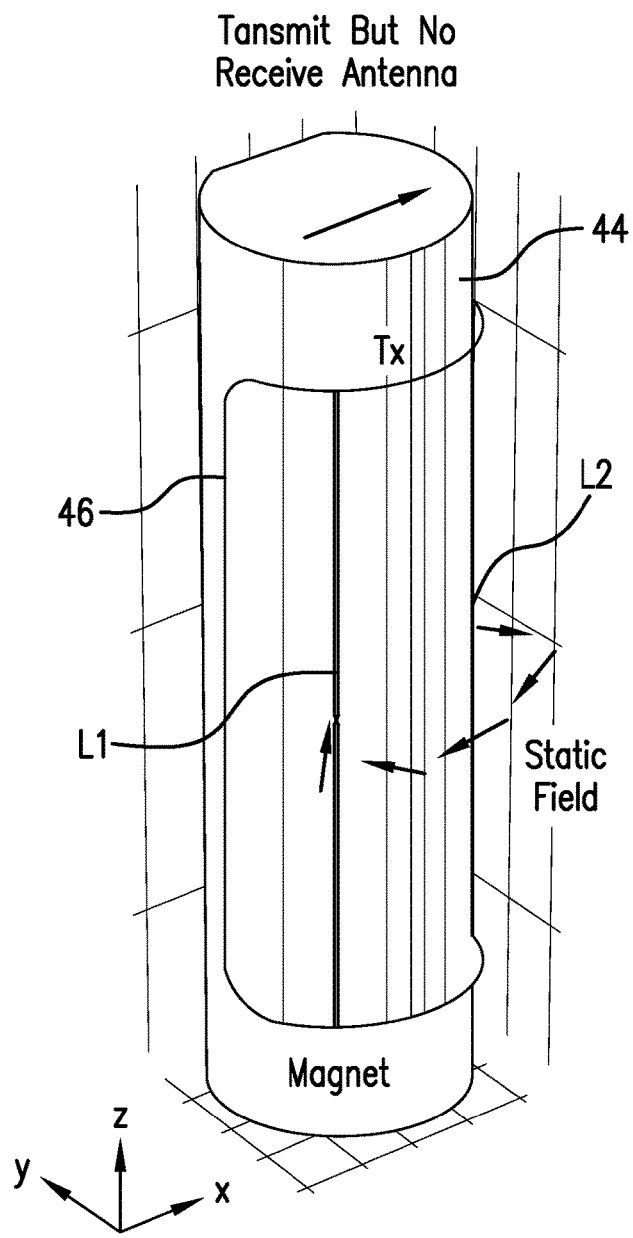
FIGS. 3A and 3B depict a portion of an embodiment of an NMR measurement apparatus for side-looking measurements.
Figure 3B:
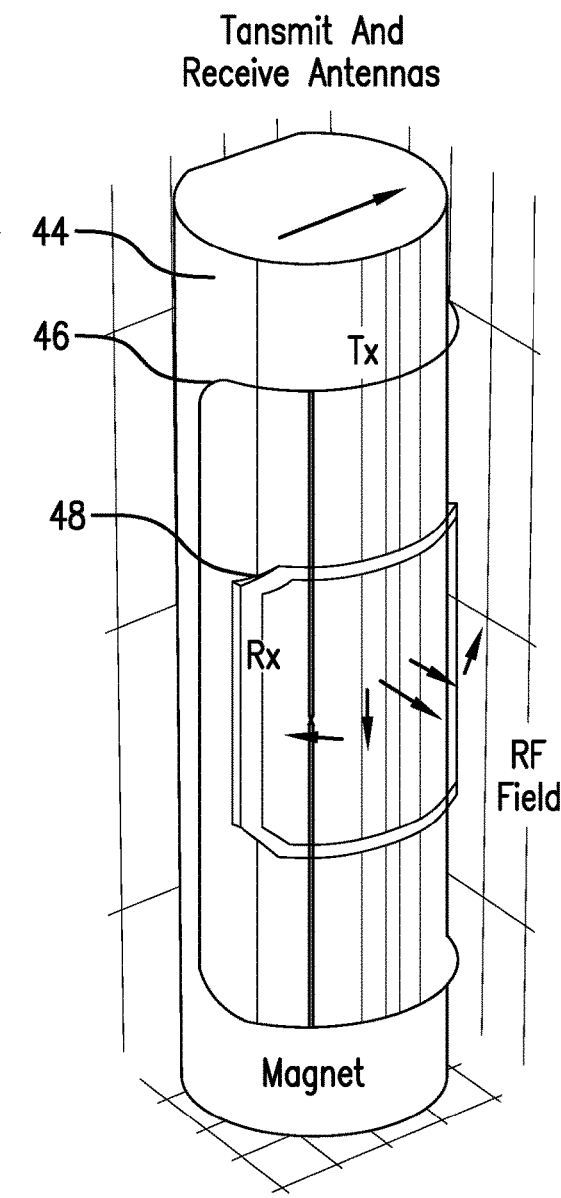

In this example, the tool 40 is a directional tool configured to generate strong magnetic fields in a volume of interest or sensitive volume within the formation. The magnet assembly 44 is oriented so that the static magnetic fields are generally in the transverse (i.e. x-y) plane perpendicular to the length of the borehole and the longitudinal tool axis (the z-axis in this example), as illustrated in FIG. 3A, and is oriented generally toward the volume of interest. The transmitting antenna 46 in this example is oriented generally in a plane perpendicular to the y-axis and emits an oscillating magnetic field at least substantially along the y-axis, as shown in FIG. 3B. FIG. 4A shows a top-down view of the magnet assembly 44 and the static magnetic field (shown as field lines 92) oriented toward a sensitive volume 90. The receiving antenna 48 is oriented in at least substantially the same direction as the transmitting antenna 46, i.e., towards the sensitive volume 90. FIG. 4B shows the magnetic field of the transmitting antenna 46 (shown as field lines 94, and FIG. 4C shows the magnetic field of the receiving antenna 48 (shown as field lines 96). The antennas are "side-looking" in that they are oriented to emit a magnetic field in a specific angular region about the longitudinal borehole (z-directed) axis. However, the tool 40 is not limited to side-looking or directional NMR configurations.

In one embodiment, the tool 40 includes separate antennas/coils for transmitting and receiving. Using separate antennas is advantageous over single antenna configurations. For single antenna tools, due to dramatic amplitude differences between transmission pulses and generated NMR signals, efforts must be spent removing energy from the antenna to faithfully receive the NMR signal. Distinct coils for excitation and reception can help mitigate these issues.

In addition, if an NMR tool is in motion during excitation of a sensitive volume and during reception, there is a spatial offset from the originally excited volume. Thus, there is an inherent sensitivity reduction with increased logging speed. With distinct coils, the receive coil may be offset from the leading edge of the transmit coil, allowing the receive coil to remain in the excited formation volume even after the tool experiences a large vertical displacement during fast logging, thereby maintaining sensitivity.

Furthermore, separate receiving and transmitting antennas allow for optimizing a transmitting antenna for volumetric coverage, and independently optimizing a receiver antenna for high measurement sensitivity and spatial resolution. Transmitting antennas should be optimized for transmit efficiency and producing the largest excitation volume in the formation, while receiving antennas should be optimized for reducing losses, increasing sensitivity, improving vertical resolution, and for achieving high measurement signal-to-noise ratio (SNR).

Embodiments described herein include distinct transmitting and receiving antennas that provide effective inductive decoupling or isolation from each other so that the advantages of distinct coils can be realized while reducing or eliminating the problems that result from mutual inductive coupling. The configurations of distinct transmitting and receiving antennas described herein provide effective decoupling that cannot be sufficiently addressed using active electronic decoupling methods alone. The embodiments facilitate enhanced-sensitivity NMR with multiple antennas, relax active decoupling requirements, and thus can reduce hardware complexity.

In the example of FIGS. 3A, 3B and 4A-C, the transmitting antenna 46 is a folded transmit coil that produces RF fields that are predominantly orthogonal to the static magnetic field in the sensitive volume (as shown, e.g., in FIGS. 4A and 4B). Crossover line segments L1 and L2 of the transmit coil are adjusted such that the spatial RF pattern is highly orthogonal to the static magnetic field and the overall sensitivity is maximized.

The receiving antenna 48 is a receive loop coil that is placed in close proximity (i.e. sharing sensitivity to the same formation volume of interest) to the transmit coil, yet maintains optimal mutual decoupling from the transmit coil.

It is noted that the geometries and positions of the transmitting and receiving antennas may be similar to that of conventional arrangements in that they produce a similar magnetic field pattern in a common formation volume of interest that is substantially spatially orthogonal to the static magnetic field produced by the magnet (see, e.g., FIGS. 4A and 4B). In contrast to conventional arrangements, the geometries of the transmitting antenna 46 and the receiving antenna 48 are different enough from one another to reduce or cancel mutual coupling.

Figure 5:
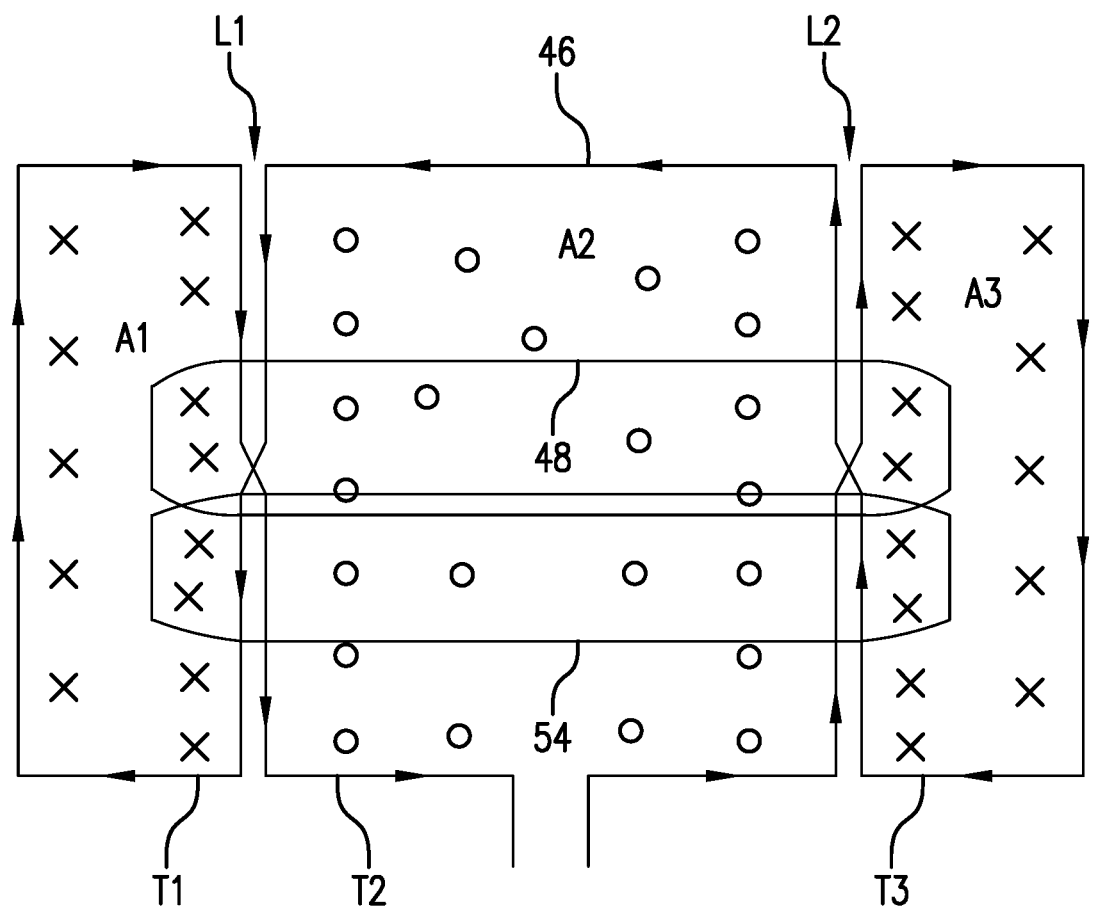
FIG. 5 depicts an embodiment of an antenna assembly including a transmitting antenna, and an array of receiving antennas inductively decoupled from the transmitting antenna.

Referring to FIG. 5, in one embodiment, the receiving antenna 48 overlaps the transmitting antenna 46 so that the net magnetic flux from the transmit antenna through the surface area of the receiving antenna is reduced or eliminated. The "surface area" of a coil or antenna refers to a region in a plane defined by the coil and bounded by the coil. It is noted that the surface area may reside in a two-dimensional space or bent into a three dimensional volume.

In one embodiment, the "surface area" of an antenna, coil or turn is an area bounded by the coil or turn when the coil or turn is projected onto a flat plane. The surface area of an antenna is the sum of all individual surface areas of individual turns or coils. The surface area may be a geometric surface area and/or an effective surface area. The "geometric surface area" is an area that is physically defined by the antenna, turn or coil, when projected onto a plane. The "effective surface area" of an antenna or coil is defined as being based on the total of the geometric surface area(s) of the coil (or total of the geometric surface areas of each coil in the antenna) that are impacted by the direction of flux produced in the geometric surface area(s), and by the number of turns around the surface area(s).

For example, the transmitting antenna 46 of FIG. 5 is a folded antenna that includes three turns T1, T2 and T3, each of which defines respective geometric surface areas A1, A2 and A3. The "geometric surface area" of the transmitting antenna 46 in this example can be defined as the sum of the respective surface areas A1, A2 and A3, i.e. surface area=A1+A2+A3. As each of the surface areas A1, A2 and A3 are impacted by the flux direction in this example, the geometric surface area and the effective surface area of the transmitting antenna 46 are different, i.e., effective surface area=A1−A2+A3. The "surface area" of a multi-turn coil (such as the antenna 46 of FIG. 6B) may be defined as the geometric surface area bound by the turns or the effective surface area, which is the geometric surface area multiplied by the number of turns.

The receiving antenna 48, which in this embodiment is a single coil (but is not so limited), is configured relative to the transmitting antenna 46 so that the surface area defined by the receiving antenna 48 intersects regions of opposite transmitting magnetic flux that partially or entirely cancel each other out so that the total magnetic flux of the transmitting antenna 48 through the receiving antenna surface area (geometric or effective surface area) is zero or substantially reduced, thereby achieving decoupling. As shown in FIG. 5, the antenna assembly may include a single receiving antenna (e.g., the receiving antenna 48) or may include one or more additional receiving antennas (e.g., an additional receiving antenna 54) that may be decoupled from both the transmitting antenna and/or the receiving antenna 48 through methods such as overlap decoupling.

FIGS. 6A-6D illustrate examples of antenna configurations that achieve inductive decoupling by canceling the magnetic flux between transmitting and receiving antennas. In these examples, the antennas are shown in a flat plane (i.e. projected from a 3D shape into a 2D plane), however the plane of the antennas may be curved (e.g., around a cylindrical magnet as shown in FIG. 3). In this plane, the receiving antenna 48 is a single coil which defines an effective surface area that corresponds to a geometric surface area equal to the spatial area bounded by the extents of the receiving coil. The magnetic flux generated by the transmitting antenna 46 through the plane is shown as points where magnetic field lines intersect the plane. The flux may be positive (represented by 'x' symbols, denoting that the flux direction is into the page) or negative (represented by 'o' symbols, denoting that the flux direction is out of the page).

Figure 6A:
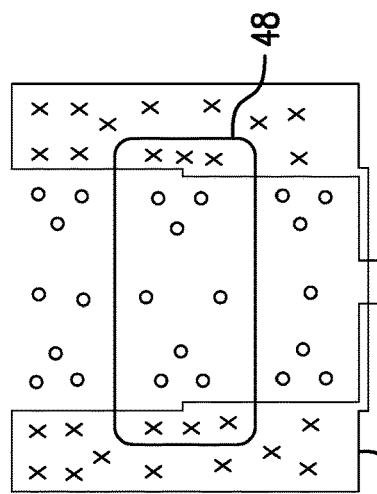
FIGS. 6A-6D depict examples of antenna assemblies configured to result in a transmitting antenna that is inductively decoupled from a receiving antenna.
Figure 6B:
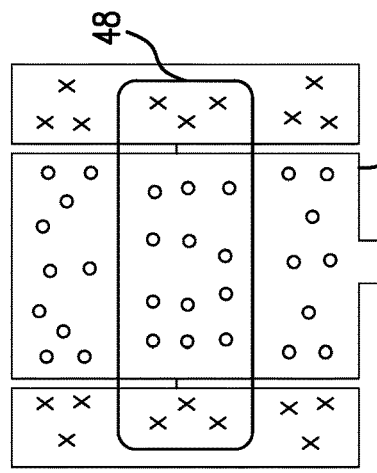
Figure 6C:
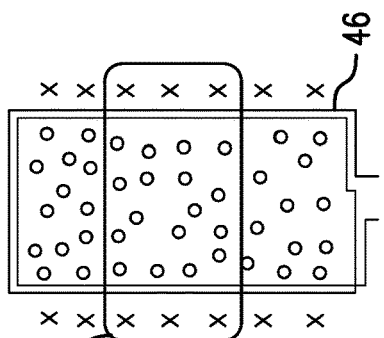
Figure 6D:
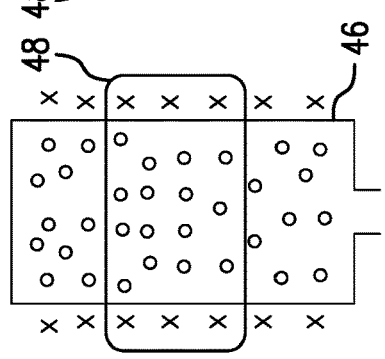

FIG. 6A shows an example in which the transmitting antenna is a single coil having a single winding (in this example, geometric surface area=effective surface area), and FIG. 6B shows an example in which the transmitting antenna is a single coil having a multiple windings (in this example, the effective surface area=2×the geometric surface area). In these examples, the receiving antenna 48 overlaps the transmitting antenna 46 and has a lateral width (i.e., about the azimuthal direction relative to the well z-axis) that is greater than the overall lateral width of the transmitting coil. FIGS. 6C and 6D show examples in which the transmitting antenna 46 includes separate windings. Here, the geometric surface area of the transmitting antenna 46 in FIG. 6D is less than the surface area of the transmitting antenna 46 in FIG. 6C, but the effective surface area of the transmitting antenna 46 in FIG. 6D is greater than that of FIG. 6C due to varying flux directions and the lack of a closed top segment in the transmitting antenna 46 of FIG. 6D.

In each of the examples of FIGS. 3-6, the receiving antenna overlaps the transmitting antenna so that the surface area of the receiving antenna 48 includes portions of the surface area having opposing magnetic flux from the transmitting antenna. For example, in FIG. 5, two portions of the receiving antenna's 48 surface area intersect regions of the transmitting antenna 46 through which the magnetic flux is positive (regions A1 and A3 defined by turns T1 and T3, respectively), and a third portion of the surface area intersects a region through which the magnetic flux of the transmit antenna is negative (region A2 defined by turn T2). In one embodiment, the receiving antenna 48 is configured so that the total area of the two portions is equal to or nearly equal to the area of the third portion, or otherwise configured so that the magnitude of magnetic flux through the first portions (portions in regions A1 and A3) is at least substantially equal to the magnitude of magnetic flux through the third portion (the portion in region A2).

The configurations, size and surface areas (the geometric surface area and/or effective surface area are not limited to the embodiments discussed above, as different combinations of transmitting antenna and receiving antenna surface areas may be used. For example, a receiving antenna (e.g., the receiving antenna 48) can define a geometric surface area (RxSA) that is greater than a geometric surface area (TxSA) defined by a transmitting antenna (e.g., the transmitting antenna 46), or the receiving antenna geometric surface area RxSA can be less than the transmitting antenna geometric surface area TxSA. Likewise, the receiving antenna can define an effective surface area (RxESA) that is greater than an effective surface area (TxESA) defined by the transmitting antenna, or the receiving antenna effective surface area RxESA can be less than the transmitting antenna effective surface area TxESA.

In other examples, the receiving antenna effective surface area RxESA can be configured to be greater than the transmitting antenna geometric surface area TxSA, or the receiving antenna effective surface area RxESA can be configured to be less than the transmitting antenna geometric surface area TxSA. In yet other examples, the receiving antenna geometric surface area RxSA can be configured to be greater than the transmitting antenna effective surface area TxESA, or the receiving antenna geometric surface area RxSA can be configured to be less than the transmitting antenna effective surface area TxESA.

The configurations of FIGS. 6A-6D can be compared to conventional configurations, in which the receiving antenna coil (i.e., receive coil) is entirely contained within the transmit coil, or is entirely contained within a region having magnetic flux in one direction. If the receive coil is contained within the transmit coil, where all flux is in the same direction, mutual coupling will be extremely high. Alternatively, if the geometry of the transmit coil is modified i.e. by stretching the width or by folding the transmit coil over the receive coil, transmit antenna flux through the receive coil is both positive and negative, resulting in an overall flux cancellation and a minimized mutual inductance.

The embodiments described herein are not limited to the specific examples discussed above. For example, although the receiver coils shown in FIGS. 6A-6D are of the conventional sense (i.e. round and rectangular) and the transmitting coils making up the transmitting antenna 46 shown in FIGS. 6C and 6D have a crossover producing an opposing flux pattern, (where the flux in one region at least predominantly opposes the flux in another region), the antenna assembly can instead include a round or rectangular transmit coil(s) and receive coil(s) that are folded or crossed over. In another example, the transmitting antenna is used for transmission and both the transmitting and receiving antennas are used for simultaneous reception. Finally, the transmitting antenna does not need to be a single continuous coil, but could be made up of several smaller coils producing an array about the tool azimuth, but working together to excite the volume of interest (e.g., the sensitive volume 90 of FIG. 4) that is primarily in front of the tool 40.

Figure 7A:
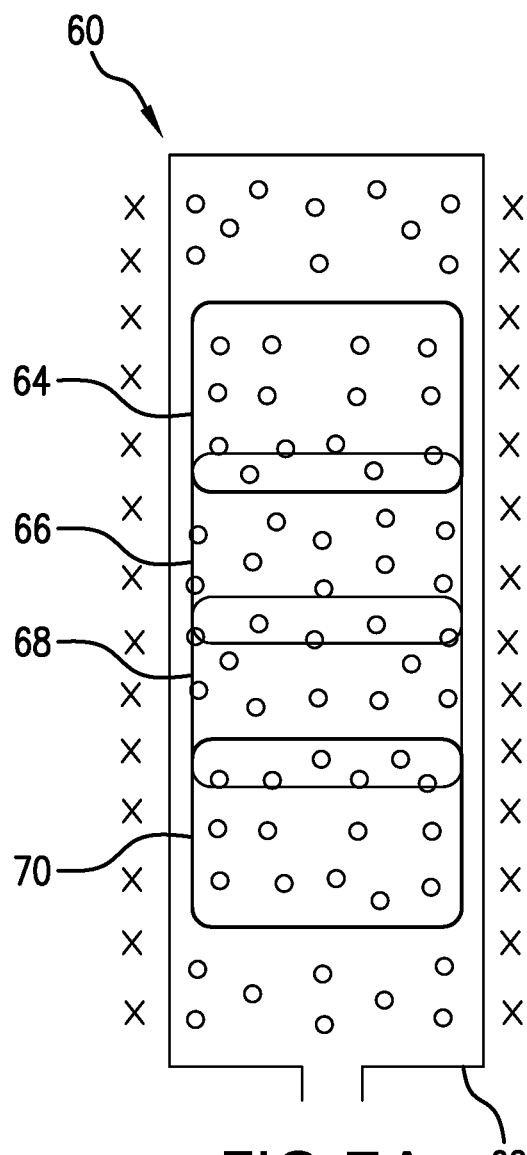
FIGS. 7A and 7B depict an example of an antenna assembly including a transmitting antenna and an array of decoupled receiving antennas that are also decoupled from the transmitting antenna, as compared to a conventional transmitting antenna assembly that is inductively coupled to the receive antenna assembly.
Figure 7B:
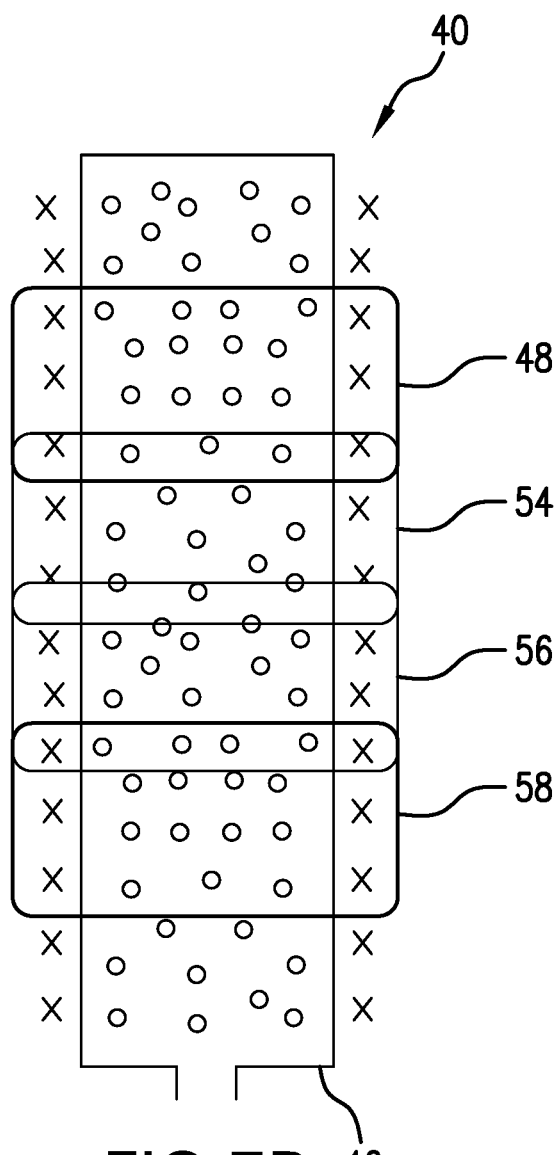

FIG. 7B shows an embodiment in which multiple separate receiving coils are disposed with a single transmitting antenna. In this embodiment, the antenna assembly includes a single transmitting coil and an array of receiving antennas 48, 54, 56 and 58. Each receiving antenna is configured so that mutual inductance is simultaneously reduced or minimized between adjacent receive coils and the transmitting antenna. If mutual inductance is completely cancelled, the transmitting antenna could be used to simultaneously receive the NMR signal, along with the receiver antennas, providing yet another measurement that could be combined to improve overall sensitivity.

In the embodiment of FIG. 7B, each of the receiving antennas overlaps the transmitting antenna so that each receiving antenna intersects regions of opposite magnetic flux produced by the transmitting antenna. This can be contrasted with an example of a conventional coupled design 60 shown in FIG. 7A, in which multiple receiving antennas 64, 66, 68 and 70 are all contained within the surface area of a transmitting antenna 62 that has flux in one primary (positive or negative) direction.

The transmitting antenna can include a single winding coil, a single coil with multiple co-located windings, or multiple independent coils. For example, as shown in FIGS. 8A-8D, the transmitting antenna 46 can be configured as multiple distinctly placed windings (FIGS. 8A and 8B) or an array of separate coils (FIGS. 8C and 8D). The various coils can be driven with identical current patterns or the phase and amplitude of each current pattern could be varied to achieve the desired result.

FIGS. 8A-8D show various examples of transmitting arrays that include arrays of windings of a single loop or arrays of separate coils. The array coils, in one embodiment, are distributed along an azimuthal direction relative to the longitudinal axis of a NMR tool. These examples also demonstrate that the antenna assembly can have a variety of configurations including transmitting antennas and/or coils of varying sizes relative to receiving antennas. These examples are discussed in the context of an NMR tool having a longitudinal axis and transmitting coils arrayed in an azimuthal direction relative to the longitudinal axis, but are not so limited.

FIG. 8A shows an embodiment of the transmitting antenna 46 that includes two windings of a single coil, where the windings are separated along the azimuthal direction. In this example, the total surface area defined by the two windings is larger than the surface area defined by the receiving antenna 48. FIG. 8B shows a similar configuration, but with multiple receiving antennas 48 and 54 arrayed in a direction parallel to the longitudinal axis of an NMR tool.

FIG. 8C shows a configuration in which the transmitting antenna 46 includes two separate transmitting coils 72 and 74. Each of the transmitting coils in the example of FIG. 8C has a surface area that is less than the surface area of each receiving antenna. FIG. 8D shows a configuration in which the transmitting antenna 46 includes multiple separate transmitting coils 76, 78 and 80 having varying surface areas.

The measurement apparatuses and antenna configurations described herein may be used in various methods for estimating formation characteristics. An example of a method includes taking downhole NMR measurements as part of wireline well logging and/or LWD operation. The method may be performed in conjunction with the system 10 and/or embodiments of the NMR apparatus, but is not limited thereto. The method includes one or more stages described below. In one embodiment, the method includes the execution of all of the stages in the order described. However, certain stages may be omitted, stages may be added, or the order of the stages changed.

In a first stage, a NMR or other magnetic resonance measurement tool is deployed into a borehole. In one embodiment, the tool (e.g., the tool 14) is deployed as part of an open hole wireline operation, or during drilling as part of a LWD operation. The tool includes a permanent magnet array having a rotating or alternating pattern of orientations as described above.

In the second stage, a static magnetic field $B_0$ is generated in the surrounding formation volume, and a radiofrequency (RF) or other pulsed signal is transmitted from at least one transmitting antenna, which in turn generates an oscillating magnetic field $B_1$ in the volume of interest. At least one receiving antenna detects NMR signals from the volume in response to the interaction between the nuclear spins of interest and the static and oscillating magnetic fields, and generates raw NMR data. The raw NMR data includes spin echo trains measured at a plurality of depths. NMR data is generated at multiple depths, during which the tool may be moving or stationary. In one embodiment, data is generated at a sufficient number of depths so that a continuous or near-continuous NMR log can be generated.

In the third stage, the NMR data is analyzed to estimate characteristics of the formation. For example, the spin echo data is converted to a distribution of $T_2$ relaxation times. $T_2$ distributions can then be used to estimate permeability and fluid properties, or to perform fluid typing or more advanced petrophysical analyses.

Set forth below are some embodiments of the foregoing disclosure:

Embodiment 1

A nuclear magnetic resonance apparatus for estimating properties of an earth formation, the apparatus comprising: a carrier configured to be deployed in a borehole in the earth formation; a magnet assembly disposed in the carrier and configured to generate a static magnetic field in the formation; a transmitting antenna disposed in the carrier and configured to generate an oscillating magnetic field in a sensitive volume within the earth formation, the oscillating magnetic field being at least substantially orthogonal to the static magnetic field in the sensitive volume; one or more receiving antennas disposed in the carrier and configured to detect a nuclear magnetic resonance (NMR) signal originating in the sensitive volume, the one or more receiving antennas having an orientation that is at least substantially orthogonal to the static magnetic field in the sensitive volume; wherein the one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction.

Embodiment 2

The apparatus of any prior embodiment, wherein the transmitting antenna and the one or more receiving antennas are oriented toward at least substantially the same location in the formation.

Embodiment 3

The apparatus of any prior embodiment, wherein a central axis of the transmitting antenna is at the same location as a central axis of the one or more receiving antennas.

Embodiment 4

The apparatus of any prior embodiment, wherein the one or more receiving antennas are arranged so that a magnitude of the magnetic flux through the first portion of the surface area of the receiver antenna is substantially equal to a magnitude of the magnetic flux through the second portion of the surface area.

Embodiment 5

The apparatus of any prior embodiment, wherein the one or more receiving antennas are arranged to partially overlap the transmitting antenna or fully overlap the transmitting antenna.

Embodiment 6

The apparatus of any prior embodiment, wherein the one or more receiving antennas overlap the transmitting antenna so that the first portion of the surface area of the one or more receiving antennas is a central portion disposed within the first region, and the second portion of the surface area includes at least two constituent portions disposed within the second region and disposed at opposite distal ends of the central portion.

Embodiment 7

The apparatus of any prior embodiment, wherein the one or more receiving antennas include an array of separate receiving antennas, each of the separate receiving antennas overlapping the transmitting antenna.

Embodiment 8

The apparatus of any prior embodiment, wherein the transmitting antenna includes a plurality of separate coils arrayed in an azimuthal direction relative to the carrier, at least one of the separate coils defining the first region and at least another of the separate coils defining the second region.

Embodiment 9

The apparatus of any prior embodiment, wherein the one or more receiving antennas define at least one surface area that is different than a surface area defined by the transmitting antenna.

Embodiment 10

A nuclear magnetic resonance apparatus for estimating properties of an earth formation, the apparatus comprising: a carrier configured to be deployed in a borehole in the earth formation; a magnet assembly disposed in the carrier and configured to generate a static magnetic field in the formation; a transmitting antenna disposed in the carrier and configured to generate an oscillating magnetic field in a sensitive volume within the earth formation, the oscillating magnetic field being at least substantially orthogonal to the static magnetic field in the sensitive volume; one or more receiving antennas disposed in the carrier and configured to detect a nuclear magnetic resonance (NMR) signal originating in the sensitive volume, the one or more receiving antennas having an orientation that is at least substantially orthogonal to the static magnetic field in the sensitive volume; wherein the transmitting antenna is arranged relative to the one or more receiving antennas so that the transmitting antenna is inductively decoupled from the one or more receiving antennas, a first region of the transmitting antenna overlapping a first portion of the surface area of the one or more receiving antennas in which a magnetic flux of the transmitting antenna is in a first direction, and a second region of the transmitting antenna overlapping a second portion of the surface area of the one or more receiver antennas overlapping a in which the magnetic flux is in a second direction, the second direction being predominantly opposed to the first direction.

Embodiment 11

A method of estimating properties of an earth formation, the method comprising: deploying a carrier into a borehole in the earth formation; generating a static magnetic field by a magnet assembly disposed in the carrier; generating an oscillating magnetic field in a sensitive volume within the earth formation by a transmitting antenna disposed in the carrier, the oscillating magnetic field being at least substantially orthogonal to the static magnetic field in the sensitive volume; and detecting a nuclear magnetic resonance (NMR) signal by one or more receiving antennas, the one or more receiving antennas having an orientation that is at least substantially orthogonal to the static magnetic field in the sensitive volume, wherein the one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction; and estimating the properties of the earth formation based on the detected signal.

Embodiment 12

The method of any prior embodiment, wherein the transmitting antenna and the one or more receiving antennas are oriented toward at least substantially the same location in the formation.

Embodiment 13

The method of any prior embodiment, wherein a central axis of the transmitting antenna is at the same location as a central axis of the one or more receiving antennas.

Embodiment 14

The method of any prior embodiment, wherein the one or more receiving antennas are arranged so that a magnitude of the magnetic flux through the first portion of the surface area of the receiver antenna is substantially equal to a magnitude of the magnetic flux through the second portion of the surface area.

Embodiment 15

The method of any prior embodiment, wherein the one or more receiving antennas are arranged to partially overlap the transmitting antenna or fully overlap the transmitting antenna.

Embodiment 16

The method of any prior embodiment, wherein the one or more receiving antennas overlap the transmitting antenna so that the first portion of the surface area of the one or more receiving antennas is a central portion disposed within the first region, and the second portion of the surface area includes at least two constituent portions disposed within the second region and disposed at opposite distal ends of the central portion.

Embodiment 17

The method of any prior embodiment, wherein the one or more receiving antennas include an array of separate receiving antennas, each of the separate receiving antennas overlapping the transmitting antenna.

Embodiment 18

The method of any prior embodiment, wherein the transmitting antenna includes a plurality of coil windings arrayed in an azimuthal direction relative to the carrier.

Embodiment 19

The method of any prior embodiment, wherein the transmitting antenna includes a plurality of separate coils arrayed in an azimuthal direction relative to the carrier, at least one of the separate coils defining the first region and at least another of the separate coils defining the second region.

Embodiment 20

The method of any prior embodiment, wherein the one or more receiving antennas defines at least one surface area that is different than a surface area defined by the transmitting antenna.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A nuclear magnetic resonance apparatus for estimating properties of an earth formation, the apparatus comprising:
a carrier configured to be deployed in a borehole in the earth formation;
a magnet assembly disposed in the carrier and configured to generate a static magnetic field in the formation;
a transmitting antenna disposed in the carrier and configured to generate an oscillating magnetic field in a sensitive volume within the earth formation, the oscillating magnetic field being at least substantially orthogonal to the static magnetic field in the sensitive volume;
one or more receiving antennas disposed in the carrier and configured to detect a nuclear magnetic resonance (NMR) signal originating in the sensitive volume, the one or more receiving antennas having an orientation that is at least substantially orthogonal to the static magnetic field in the sensitive volume, the one or more receiving antennas having a surface area;
wherein the one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction.

2. The apparatus of claim 1, wherein the transmitting antenna and the one or more receiving antennas have surface areas that reside in the same plane.

3. The apparatus of claim 2, wherein the transmitting antenna and the one or more receiving antennas are oriented toward at least substantially the same location in the formation, and a central axis of the transmitting antenna is at the same location as a central axis of the one or more receiving antennas.

4. The apparatus of claim 1, wherein the one or more receiving antennas are arranged so that a magnitude of the magnetic flux through the first portion of the surface area of the receiver antenna is substantially equal to a magnitude of the magnetic flux through the second portion of the surface area.

5. The apparatus of claim 1, wherein the first region and the second region correspond to separate regions of the surface area of the one or more receiving antennas.

6. The apparatus of claim 5, wherein the one or more receiving antennas overlap the transmitting antenna so that the first portion of the surface area of the one or more receiving antennas is a central portion disposed within the first region, and the second portion of the surface area includes at least two constituent portions disposed within the second region and disposed at opposite distal ends of the central portion.

7. The apparatus of claim 5, wherein the one or more receiving antennas include an array of separate receiving antennas, each of the separate receiving antennas overlapping the transmitting antenna.

8. The apparatus of claim 1, wherein the transmitting antenna includes a plurality of separate coils arrayed in an azimuthal direction relative to the carrier, at least one of the separate coils defining the first region and at least another of the separate coils defining the second region.

9. The apparatus of claim 1, wherein the carrier includes a cylindrical body, and the one or more receiving antennas and the transmitting antenna reside in a curved plane corresponding to a surface of the cylindrical body.

10. A nuclear magnetic resonance apparatus for estimating properties of an earth formation, the apparatus comprising:
a carrier configured to be deployed in a borehole in the earth formation;
a magnet assembly disposed in the carrier and configured to generate a static magnetic field in the formation;
a transmitting antenna disposed in the carrier and configured to generate an oscillating magnetic field in a sensitive volume within the earth formation, the oscillating magnetic field being at least substantially orthogonal to the static magnetic field in the sensitive volume;
one or more receiving antennas disposed in the carrier and configured to detect a nuclear magnetic resonance (NMR) signal originating in the sensitive volume, the one or more receiving antennas having an orientation that is at least substantially orthogonal to the static magnetic field in the sensitive volume, the one or more receiving antennas having a surface area;
wherein the transmitting antenna is arranged relative to the one or more receiving antennas so that the transmitting antenna is inductively decoupled from the one or more receiving antennas, a first region of the transmitting antenna overlapping a first portion of a surface area of the one or more receiving antennas in which a magnetic flux of the transmitting antenna is in a first direction, and a second region of the transmitting antenna overlapping a second portion of the surface area of the one or more receiver antennas overlapping a in which the magnetic flux is in a second direction, the second direction being predominantly opposed to the first direction.

11. A method of estimating properties of an earth formation, the method comprising:
deploying a carrier into a borehole in the earth formation;
generating a static magnetic field by a magnet assembly disposed in the carrier;
generating an oscillating magnetic field in a sensitive volume within the earth formation by a transmitting antenna disposed in the carrier, the oscillating magnetic field being at least substantially orthogonal to the static magnetic field in the sensitive volume; and
detecting a nuclear magnetic resonance (NMR) signal by one or more receiving antennas, the one or more receiving antennas having an orientation that is at least substantially orthogonal to the static magnetic field in the sensitive volume, the one or more receiving antennas having a surface area, wherein the one or more receiving antennas are arranged relative to the transmitting antenna so that the one or more receiving antennas are inductively decoupled from the transmitting antenna, a first portion of the surface area of the one or more receiving antennas overlapping a first region of the transmitting antenna in which a magnetic flux of the transmitting antenna is in a first direction, and a second portion of the surface area of the one or more receiver antennas overlapping a second region of the transmitting antenna in which the magnetic flux is in a second direction, the second direction being predominantly opposed to the first direction; and
estimating the properties of the earth formation based on the detected signal.

12. The method of claim 11, wherein the transmitting antenna and the one or more receiving antennas have surface areas that reside in the same plane.

13. The method of claim 12, wherein the transmitting antenna and the one or more receiving antennas are oriented toward at least substantially the same location in the formation, and a central axis of the transmitting antenna is at the same location as a central axis of the one or more receiving antennas.

14. The method of claim 11, wherein the one or more receiving antennas are arranged so that a magnitude of the magnetic flux through the first portion of the surface area of the receiver antenna is substantially equal to a magnitude of the magnetic flux through the second portion of the surface area.

15. The method of claim 11, wherein the first region and the second region correspond to separate regions of the surface area of the one or more receiving antennas.

16. The method of claim 15, wherein the one or more receiving antennas overlap the transmitting antenna so that the first portion of the surface area of the one or more receiving antennas is a central portion disposed within the first region, and the second portion of the surface area includes at least two constituent portions disposed within the second region and disposed at opposite distal ends of the central portion.

17. The method of claim 15, wherein the one or more receiving antennas include an array of separate receiving antennas, each of the separate receiving antennas overlapping the transmitting antenna.

18. The method of claim 11, wherein the transmitting antenna includes a plurality of coil windings arrayed in an azimuthal direction relative to the carrier.

19. The method of claim 11, wherein the transmitting antenna includes a plurality of separate coils arrayed in an azimuthal direction relative to the carrier, at least one of the separate coils defining the first region and at least another of the separate coils defining the second region.

20. The method of claim 11, wherein the carrier includes a cylindrical body, and the one or more receiving antennas and the transmitting antenna reside in a curved plane corresponding to a surface of the cylindrical body.

* * * * *